(12) United States Patent
Kawashima et al.

(10) Patent No.: US 7,554,410 B2
(45) Date of Patent: Jun. 30, 2009

(54) POWER AMPLIFIER

(75) Inventors: Katsuhiko Kawashima, Hyogo (JP);
Masahiro Maeda, Osaka (JP);
Masatoshi Kamitani, Osaka (JP)

(73) Assignee: Panasonic Corporation, Osaka (JP)

( * ) Notice: Subject to any disclaimer, the term of this patent is extended or adjusted under 35 U.S.C. 154(b) by 82 days.

(21) Appl. No.: 11/822,906

(22) Filed: Jul. 11, 2007

(65) Prior Publication Data
US 2008/0094142 A1     Apr. 24, 2008

(30) Foreign Application Priority Data
Oct. 18, 2006   (JP)   ............... 2006-283419

(51) Int. Cl.
*H03F 3/04* (2006.01)
(52) U.S. Cl. .................. 330/302; 330/306
(58) Field of Classification Search ........... 330/302, 330/306
See application file for complete search history.

(56) References Cited

U.S. PATENT DOCUMENTS

| | | | | |
|---|---|---|---|---|
| 4,717,884 A | * | 1/1988 | Mitzlaff | 330/251 |
| 5,406,224 A | * | 4/1995 | Mikami et al. | 330/277 |
| 6,163,221 A | * | 12/2000 | Matsuno | 330/302 |
| 6,236,274 B1 | * | 5/2001 | Liu | 330/302 |
| 6,535,069 B2 | * | 3/2003 | Fujioka et al. | 330/302 |
| 7,176,769 B1 | * | 2/2007 | Ellis | 333/125 |
| 7,362,171 B2 | * | 4/2008 | Kunihiro | 330/126 |

FOREIGN PATENT DOCUMENTS

| | | |
|---|---|---|
| JP | 2000-40928 | 2/2000 |
| JP | 2002-43873 | 2/2002 |

* cited by examiner

*Primary Examiner*—Patricia Nguyen
(74) *Attorney, Agent, or Firm*—McDermott Will & Emery LLP

(57) ABSTRACT

A power amplifier amplifies an input signal having a fundamental frequency of which band width ranges between a first fundamental frequency F1 and a second fundamental frequency F2. The power amplifier includes a power amplifier transistor for amplifying the input signal and an output matching circuit for suppressing a harmonic component included in an output signal from the power amplifier transistor. The output matching circuit includes: a first second-order harmonic series resonant circuit including a first inductor and a first capacitor and having a frequency twice as large as F1 as a resonance frequency; and a second second-order harmonic series resonant circuit including a second inductor and a second capacitor and having a frequency twice as large as F2 as a resonance frequency.

8 Claims, 4 Drawing Sheets

POWER AMPLIFIER

FIELD OF THE INVENTION

The present invention relates to a circuit technology for semiconductor power amplifiers used in signal transmitting sections of wireless portable terminals using radio frequency bands, such as mobile phones, and particularly relates to a technology for attaining broadband transmission frequency.

BACKGROUND ART

In recent years, multi-band and broadband use is progressing for want of frequency bands in the field of mobile phones, and therefore, power amplifiers used in the mobile phones are demanded to have increased power added efficiency over a broadband range, which is an essential characteristic.

The power added efficiency of a power amplifier depends dominantly and largely on the characteristics of an output matching circuit of the power amplifier. A semiconductor amplifier at the final stage of the power amplifier performs nonlinear operation in high power output, and therefore, circuits for processing harmonic signals generated as nonlinear components are the key. Particularly, a circuit for processing a second-order harmonic as a main harmonic is the key. In view of this, in general, a resonant circuit, in which a resonance frequency is matched to the frequency of a second-order harmonic, is connected to an output circuit, and a target harmonic is short-circuited or open-circuited to suppress excessive increase in output level of the second-order harmonic. The resonant circuit suppresses only the second-order harmonic in the entirety of an amplified output signal and is called, therefore, a second-order harmonic trap circuit in general. Further, the second-order harmonic is short-circuited generally in such a manner that a trap line or an inductor component having an inductance of 1 nH or larger is connected in series to a capacitor to form a resonant circuit having a second-order harmonic frequency as a resonance frequency and the resonant circuit is shunt-connected to the output circuit.

Patent Document 1: Japanese Patent Application Laid Open Publication No. 2002-43873

Patent Document 2: Japanese Patent Application Laid Open Publication No. 2000-40928

SUMMARY OF THE INVENTION

The frequency band of the second-order harmonic is, however, twice as large as the frequency band of the fundamental frequency of a signal input to the power amplifier, which involves, in association with an increase in band width of the fundamental frequency, difficulty in conventional impedance control of the broadband second-order harmonic. Hence, it becomes difficult for a single output matching circuit to perform matching over a broadband range.

For tackling the above problems, there have been proposed a method for attaining a broadband use by employing a power amplifier composed of power amplifiers optimized for different frequencies (see Patent Document 1), and a method for attaining broadband use by employing a complicated circuit which switches a usable circuit block for each frequency (see Patent Document 2). The above conventional methods, however, makes the circuit complicated to increase the number of components, thereby increasing the costs.

In view of the foregoing, the present invention has its object of enabling impedance control of a second-order harmonic of which band width is wider than that of a fundamental frequency while avoiding a circuit being complicated.

To attain the above object, a power amplifier in accordance with the present invention uses a single output matching circuit for performing matching over a broadband range. Specifically, means for suppressing the broadband second-order harmonic is attained by providing, for processing a broadband second-order harmonic, a conventional second-order harmonic trap circuit (first second-order harmonic trap circuit) in which an inductor having an inductance of 1 nH or larger is connected in series to a capacitor and a second second-order harmonic trap circuit which is composed of an inductor having an inductance of 1 nH or lower and a large capacitor and has a resonance frequency different from the first second-order harmonic trap circuit. Wherein, the resonance frequency of the conventional first second-order harmonic trap circuit is matched to the low frequency of the broadband second-order harmonic frequency, and the resonance frequency of the second second-order harmonic trap circuit is matched to the radio frequency of the broadband second-order harmonic frequency.

Description will be given to the operation principal of the power amplifier in accordance with the present invention. Referring to a series resonant circuit, the resonance frequency thereof is determined by a product of the inductance and the capacitance in the circuit. Even when the product is fixed for keeping the resonance frequency constant, however, the height and the width of the resonance vary according to the inductance and the capacitance. Namely, the resonance height and the resonance width increase as the inductor becomes small while the capacitance becomes large. In reverse, the resonance height and the resonance width decreases as the inductance becomes large while the capacitance becomes small. The conventional harmonic trap circuit falls in the latter case, and the resonance width is set small. Because: wide resonance width involves adverse influence on the fundamental frequency component, thereby causing loss of the fundamental frequency component.

FIG. 4 shows a result of suppression effect obtained in the case where a series resonant circuit having a second-order harmonic frequency of 1.6 GHz (the fundamental frequency is 800 MHz) as a resonance frequency is shunt-connected to a power amplifier. In FIG. 4, the graph 401 indicates a result obtained in a case using a series resonant circuit having in combination a large inductance L of 1 nH or larger (1.2 nH) and a small capacitance C (8.2 pF), and the graph 402 indicates a result obtained in a case using a series resonant circuit having in combination a small inductance L of 1 nH or lower (0.7 nH) and a large capacitance C (15 pF). As shown in FIG. 4, comparison of the result of the graph 401 with the result of the graph 402 shows approximately 5 dB decrease in suppression at 1.6 GHz harmonic frequency and approximately 4 dB increase in band-pass characteristic at the fundamental frequency of 800 MHz.

As described above, when two conventional harmonic trap circuits are provided merely, the power amplifier exhibits excellent frequency selectivity with a narrow resonance width. The narrow resonance width, however, results in insufficient suppression of the broadband second-order harmonic. In contrast, when two harmonic trap circuit having wider resonance width and high resonance height, that is, two series resonant circuit having small inductance and large capacitance are provided for granting priority to suppression of the broadband second-order harmonic, the second-order harmonic can be suppressed sufficiently while the wide resonance width influences adversely the fundamental frequency component to reduce the gain of the fundamental frequency.

In view of the foregoing, the present invention provides a first second-order harmonic trap circuit designed to be matched to the resonance frequency corresponding to the low (lower limit) frequency F1 of the broadband fundamental frequency and having large inductance and small capacitance, thereby attaining an object of suppressing the second-order harmonic while reducing the resonance width to prevent the fundamental frequency component from receiving the influence of a narrow resonance width. The present invention additionally provides a second second-order harmonic trap circuit designed to be matched to the resonance frequency corresponding to the high (upper limit) frequency F2 of the broadband fundamental frequency and having small inductance and large capacitance, thereby repressing the band-pass characteristic of the broadband second-order harmonic including the second-order harmonic of F1. In so doing, even with the broadband fundamental frequency, the influence on the fundamental frequency component is less than the case where the resonance frequency is matched to the second-order harmonic of the low frequency F1 because the resonance frequency is matched to the radio frequency F2 of the fundamental frequency.

In the present invention, the combination of the two kinds of harmonic trap circuits enables impedance control of the broadband second-order harmonic.

Referring to the actual construction of the power amplifier of the present invention, the conventional technique can attain easily the first second-order harmonic trap circuit using F1 as a resonance frequency and having large inductance and small capacitance. While, in attaining the second second-order harmonic trap circuit using F2 as a resonance frequency and having small inductance and large capacitance, some scheme is required for precisely providing a small inductance of 1 nH or lower. In the present invention, a shunt C (branch point) is formed in the middle (on the transistor output end side) of a bias line of an output transistor (a power amplifier transistor) to utilize a short-distance part of the bias line from the output end of the transistor to the shunt C as an inductor, thereby precisely providing a small inductance of 1 nH or lower.

As described above, in the present invention, impedance of the broadband second-order harmonic can be controlled by a single output matching circuit to attain highly-efficient and low-cost power amplifier with a simple circuit configuration.

In sum, the present invention provides a technique achieving high power efficiency over a broadband range by a single power amplifier and attains a low-cost broadband power amplifier. Hence, the present invention is applicable to technology for a broadband power amplifier of which usable field will expand in overall wireless communication.

DESCRIPTION OF THE PREFERRED EMBODIMENTS

A power amplifier in accordance with one embodiment of the present invention will be described below with reference to the accompanying drawings. It should be noted that the fundamental frequency of an input signal that the power amplifier of the present embodiment is to process is not limited specifically only if the fundamental frequency has a broadband width of 50 MHz or larger from a first fundamental frequency F1 to a second fundamental frequency F2. The following description refers to a fundamental frequency having a broadband width between 800 MHz and 900 MHz, both inclusive. In the present embodiment, accordingly, the first fundamental frequency F1 is 800 MHz, and the second fundamental frequency F2 is 900 MHz.

Figure 1:
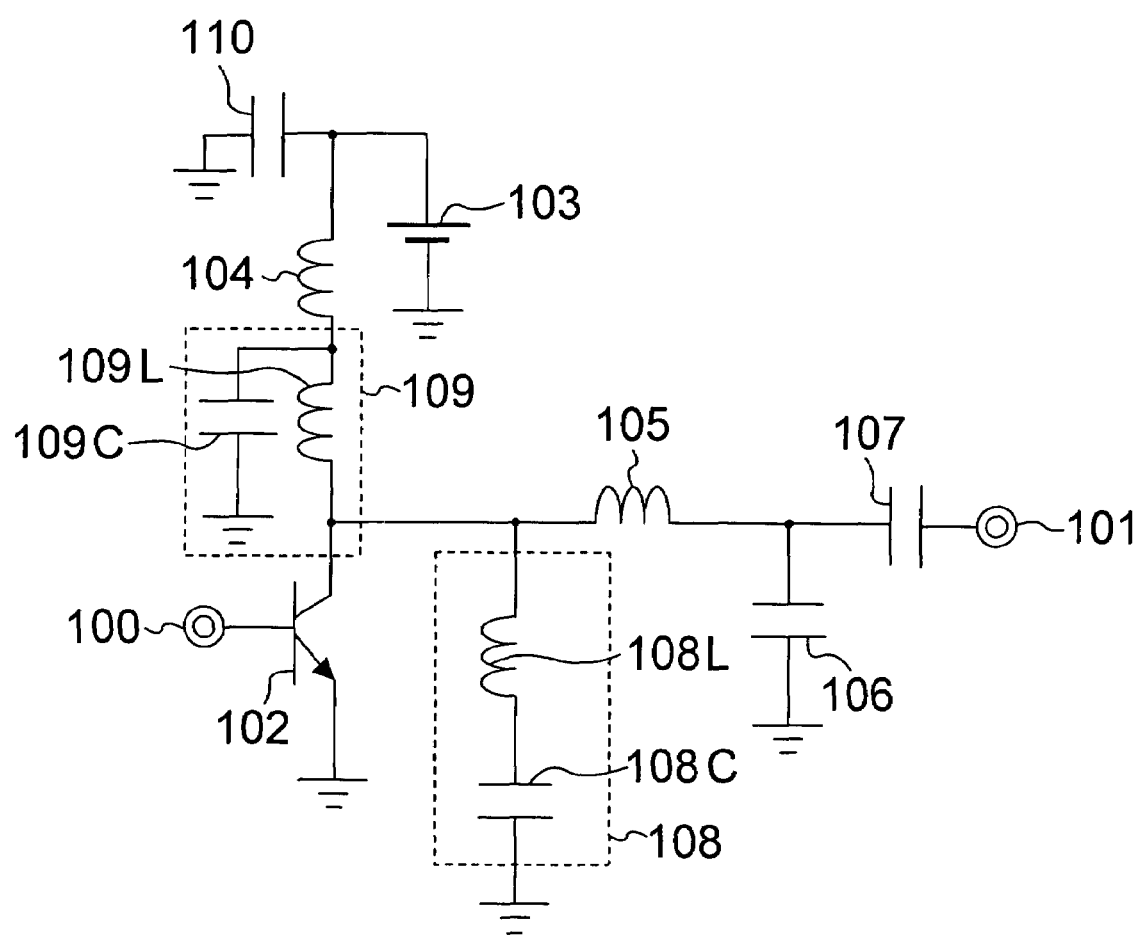
FIG. 1 is a circuit diagram of a power amplifier in accordance with one embodiment of the present invention.

FIG. 1 is a circuit diagram of the power amplifier of the present embodiment which includes an output matching circuit of the present invention. Though not shown in FIG. 1, for an actual construction of the power amplifier, there are provided a bias circuit of an output stage transistor 102, a driver stage circuit up to a signal input terminal 100 of the output stage transistor 102, a matching circuit for matching the driver stage circuit with the output stage transistor 102, and the like. Namely, a signal from the driver stage circuit is input to the signal input terminal 100 of the output stage transistor 102.

As shown in FIG. 1, bias voltage is supplied to the output stage transistor 102 from a voltage source 103 via a bias line inductor 104. The bias inductor 104 has an inductance of, for example, 7 to 15 nH. While, the electric length of the bias inductor 104, which corresponds to an electric length of a part from a bypass capacitor 110 described later to a branch point of a shunt capacitor 109C described later, is preferable to be λ/4, namely, open-circuited ideally, but may be in a range between λ/16 and λ/8, both inclusive in the actual construction. Wherein, λ represents a wavelength of an input signal. The bypass capacitor 110 having a capacitance of, for example, 1000 pF or larger is provided between the voltage source 103 and the bias line inductor 104.

On an output line from the output stage transistor 102 to an output terminal 101 of the power amplifier, there are provided a series inductor (output line inductor) 105 having an inductance of, for example, 2 to 3 nH, an output matching shunt capacitor 106 having a capacitance of, for example, 6 to 10 pF, and a output matching series capacitor 107 having a capacitance of, for example, 100 pF or larger. Thus, the fundamental frequency (primary frequency) component in the range between 800 MHz and 900 MHz is matched for the purpose of broadband amplification.

Further, in the present embodiment, two kinds of second-order harmonic trap circuits (second-order harmonic resonant circuits) of the present invention are provided, which will be described below in detail.

First, a first second-order resonant circuit 108 in which an inductor 108L having a inductance of 1 nH or larger (for example, 1 to 2 nH) and a capacitor 108C having a capacitance of, for example, 6 to 9 pF are connected in series to each other is provided at a general position, specifically, on a line branching from the output line between the output end of the output stage transistor 102 and the series inductor 105. The capacitor 108C side end of the first second-order series resonant circuit 108 is grounded. The resonance frequency of the first second-order series resonant circuit 108 is set to the second-order harmonic of the first fundamental frequency F1 (800 MHz).

A shunt capacitor 109C having a capacitance (9 to 13 pF, for example) larger than the capacitor 108C is provided on a line branching in the middle of the bias line, specifically, the line branching from the bias line at a predetermined branch point between the output end of the output stage transistor 102 and the bias line inductor 104. The opposite end of the shunt capacitor 109C to the bias line is grounded. With the above arrangement, a part of the bias line which ranges from the output end of the output stage transistor 102 to the junction point (the above predetermined branch point) of the shunt capacitor 109C serves as an inductor 109L having an inductance of 1 nH or lower (0.5 to 1 nH, for example). The output end of the output stage transistor 102 corresponds to a collector terminal when the output stage transistor 102 is a bipolar transistor or a drain terminal when it is a FET (field-effect transistor). In the present embodiment, a series resonant circuit composed of the inductor 109L and the shunt capacitor 109C functions as a second second-order series resonant circuit 109. The resonance frequency of the second second-order resonant circuit 109 is set to the second-order harmonic of the second fundamental frequency F2 (900 MHz).

It is noted that the inductor 109L may be composed of a microstrip line, for example. Further, in the case, for example, where a semiconductor substrate on which the output stage transistor 102 is integrated is mounted in a package, the capacitor 108C may be integrated also on the semiconductor substrate while a part from the output end of the output stage transistor 102 to the end of the bias line, specifically, the voltage source 103, the bypass capacitor 110, the bias line inductor 104, the inductor 109L, and the shunt capacitor 109C may be components accommodated in the package, namely, outside chip components not integrated on the semiconductor substrate and inductors utilizing the strip line in the package. In the case where the shunt capacitance 109C is such a chip component, there is no need to connect the shunt capacitance 109C to the predetermined branch point by wire bonding in contrast to the case where the shunt capacitance 109C is integrated on the semiconductor substrate. This eliminates the need to provide an inductance of 1 nH or larger, facilitating attainment of broadband use. The shunt capacitance 109C may be integrated on another semiconductor substrate different from the semiconductor substrate on which the output stage transistor 102 is integrated. This case corresponds to Claim 4.

Figure 2:
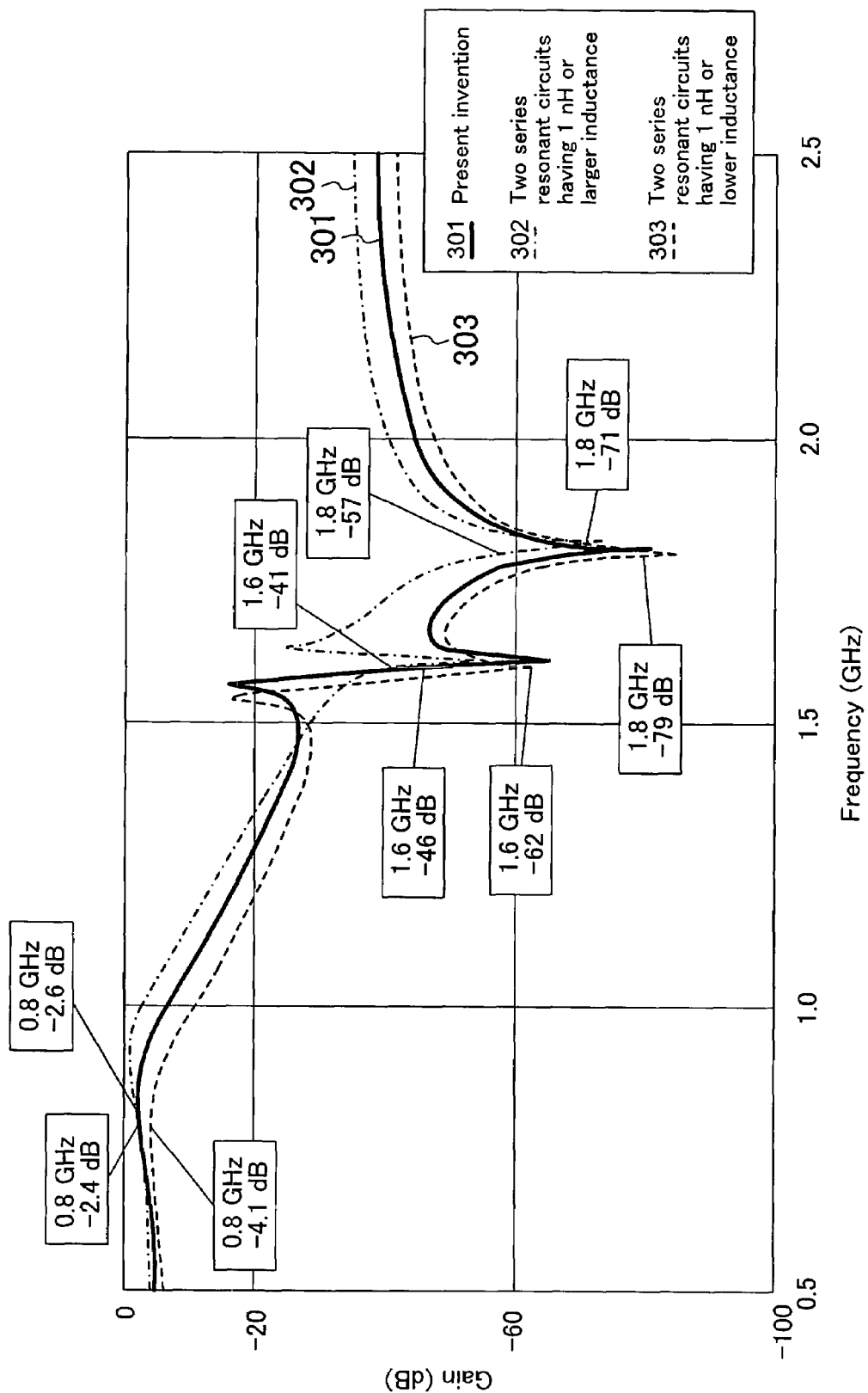
FIG. 2 is a graph showing a band-pass characteristic of an output matching circuit of the power amplifier in accordance with the embodiment of the present invention in comparison with a band-pass characteristic of an output matching circuit of a power amplifier in accordance with a comparative example.

FIG. 2 shows comparison between the band-pass characteristic obtained in the case where each series resonant circuit of the present invention is shunt-connected to the power amplifier and that obtained in the case where series resonant circuits of a comparative example, which will be described later, are shunt-connected to the power amplifier. The result of the present invention (graph 301) shown in FIG. 2 is obtained in the following condition in the ranges of the above circuit constants. Namely, the first second-order series resonant circuit 108 having a series resonance frequency of 1.6 GHz, which is twice as large as the low first fundamental frequency F1 (800 MHz) of the fundamental frequency, has an inductance of 1.3 nH and a capacitance of 7.5 pF while the second second-order series resonant circuit 109 having a series resonance frequency of 1.8 GHz, which is twice as large as the high second fundamental frequency F2 (900 MHz) of the fundamental frequency, has an inductance of 0.6 nH and a capacitance of 12 pF.

As shown in FIG. 2, in the series resonant circuits of the present invention, the band-pass characteristic at the second-order harmonic (1.6 GHz) of the first fundamental frequency F1 (800 MHz) is approximately −46 dB while the band-pass characteristic at the second-order harmonic (1.8 GHz) of the second fundamental frequency F2 (900 MHz) is approximately −71 dB, which are excellent band-pass characteristics that exhibit a sufficient effect of suppressing the respective harmonic frequencies. A band-pass characteristic of approximately −2.6 dB loss is observed at the first fundamental frequency F1 (800 MHz), which is ignorable.

As described above, in the present embodiment, the first second-order series resonant circuit 108, that is, the first second-order harmonic trap circuit is designed to have a resonance frequency matched correspondingly to the low frequency (lower limit) F1 of the broadband fundamental frequency and is composed of a combination of a large inductor and a small capacitor, thereby suppressing the second-order harmonic while reducing the resonance width to prevent influence on the fundamental frequency component. On the other hand, the second second-order series resonant circuit 109, that is, the second second-order harmonic trap circuit is designed to have a resonance frequency matched correspondingly to the radio frequency (upper limit) F2 of the broadband fundamental frequency and is composed of a combination of a small inductor and a large capacitor, thereby suppressing loss of the band-pass characteristic of the broadband second-order harmonic including the second-order harmonic of the low frequency F1. With the second second-order harmonic trap circuit, of which resonance frequency is matched to the second-order harmonic of the radio frequency F2 of the fundamental frequency, the fundamental frequency component of the broadband fundamental frequency is less influenced when compared with the resonance frequency matched to the second-order harmonic of the low frequency F1.

Hence, in the present embodiment, the combination of the first second-order series resonant circuit 108 and the second second-order series resonant circuit 109 enables impedance control of the broadband second-order harmonic. In other words, impedance control of the broadband second-order harmonic is achieved with a single output matching circuit, attaining a highly-efficient and low-cost power amplifier with a simple construction.

COMPARATIVE EXAMPLE

Power transistors in accordance with the comparative example will be described next with reference to the drawings.

Figure 3:
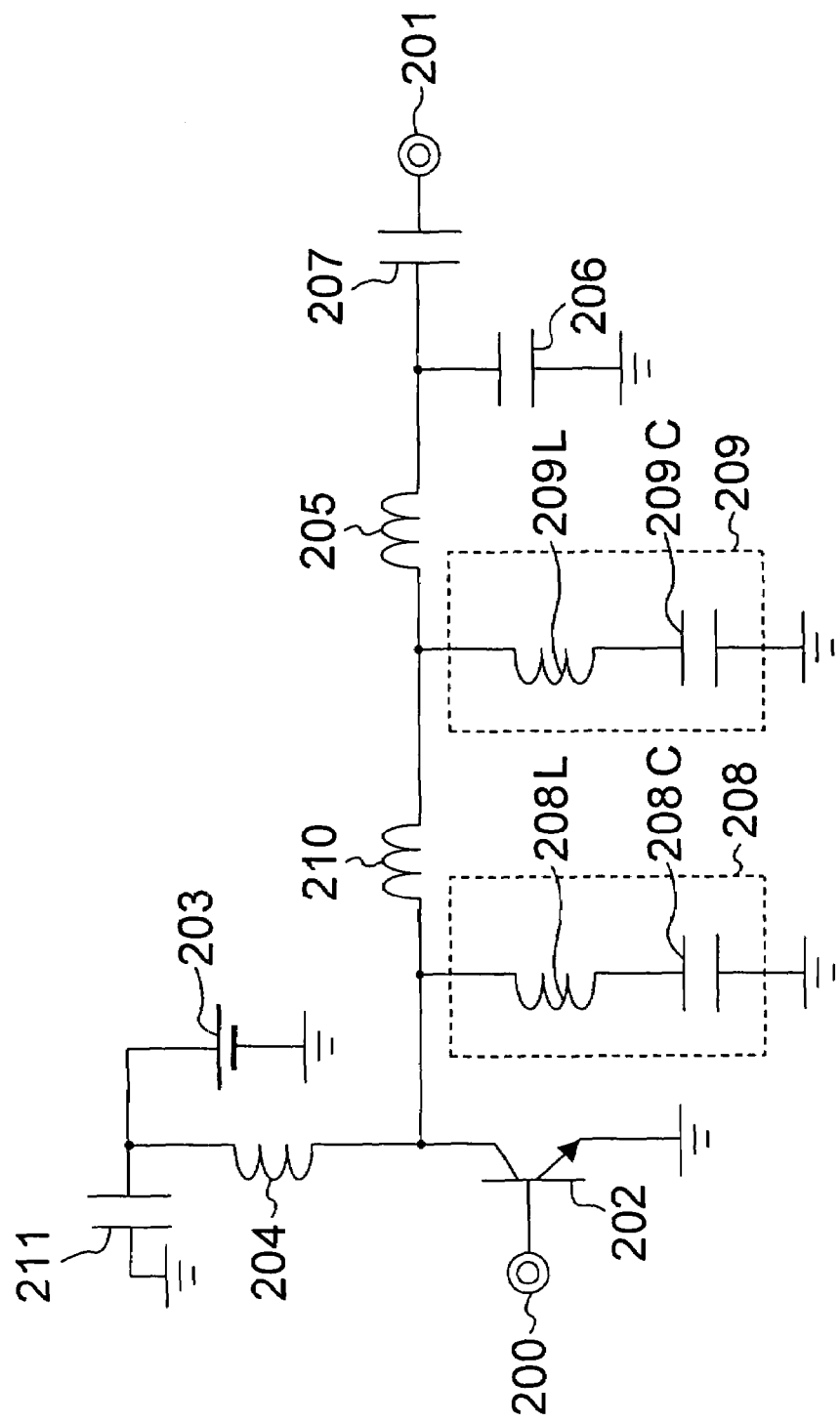
FIG. 3 is a circuit diagram of the power amplifier in accordance with the comparative example.
Figure 4:
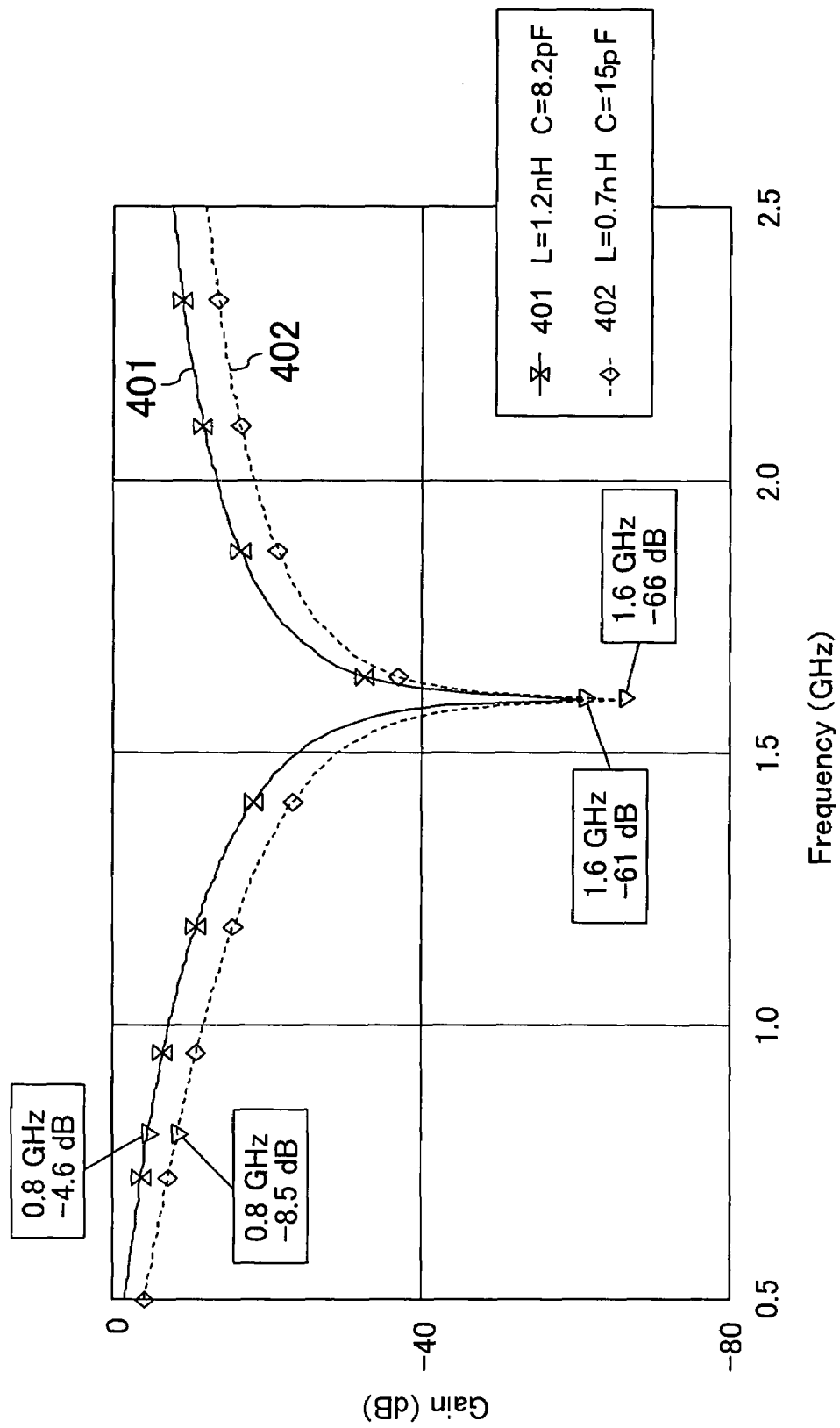
FIG. 4 is a graph showing a relationship between the band-pass characteristic of an output matching circuit of an amplifier and the inductance or capacitance of a second-order harmonic trap circuit used in the output matching circuit.

FIG. 3 is a circuit diagram of a power amplifier in accordance with the comparative example, which includes a power amplifier transistor and an output matching circuit. As shown in FIG. 3, bias voltage is supplied to an output stage transistor 202 from a voltage source 203 via a bias line inductor 204. A bypass capacitor 211 is provided between the voltage source 203 and the bias line inductor 204. On an output line from the output stage transistor 202 to an output terminal 201 of the power amplifier, there are provided a series inductor (output line inductor) 205, an output matching shunt capacitor 206, and an output matching series capacitor 207. Further, in the comparative example, two second-order harmonic trap circuits (second-order harmonic resonant circuits) are provided. Specifically, a first second-order series resonant circuit 208 in which an inductor 208L and a capacitor 208C are connected in series to each other is provided on a line branching from the output line between the output end of the output stage transistor 202 and the series inductor 205. A second second-order series resonant circuit 209 in which an inductor 209L and a capacitor 209C are connected in series to each other is provided on a line branching from the output line between the branch point of the first second-order resonant circuit 208 and the series inductor 205. An inductor 210 is provided between the branch point of the first second-order series resonant circuit 208 and the branch point of the second second-order series resonant circuit 209 on the output line.

Referring to FIG. 2, the graph 302 indicates a band-pass characteristic obtained in the case where both the two second-order series resonant circuits 208, 209 have an inductance of 1nH or larger (first comparative example), more specifically, where the first second-order series resonant circuit 208 has an inductance of 1.3 nH and a capacitance of 7.5 pF and the second second-order series resonant circuit 209 has an inductance of 1.3 nH and a capacitance of 5.9 pF. As well, the graph 303 indicates a band-pass characteristic obtained in the case where both the two second-order series resonant circuits 208, 209 have an inductance of 1 nH or smaller (second comparative example), more specifically, where the first second-order series resonant circuit 208 has an inductance of 0.65 nH and a capacitance of 15 pF and the second second-order series resonant circuit 209 has an inductance of 0.65 nH and a capacitance of 12 pF.

The graph 302 in FIG. 2 proves that: in a power amplifier including the two second-order series resonant circuits having an inductance of 1 nH or lager, while the band-pass characteristic loss at the low fundamental frequency F1 (800 MHz) is approximately −2.4 dB, which involves no problem, the band-pass characteristic losses at the second-order harmonic (1.6 GHz) of the fundamental frequency F1 and the second-order harmonic (1.8 GHz) of the high fundamental frequency F2 (900 MHz) are approximately −41 dB and approximately −57 dB, respectively, which results in insufficient suppression of the second-order harmonic. It is also understood that the frequency component between 1.6 GHz and 1.8 GHz is suppressed insufficiently due to the narrow resonant width.

As well, the graph 303 in FIG. 2 proves that: in a power amplifier including the two second-order series resonant circuit having an inductance of 1 nH or lower, while the band-pass characteristics of the second-order harmonic (1.6 GHz) of the low fundamental frequency F1 and the second-order harmonic (1.8 GHz) of the high fundamental frequency F2 are approximately −62 dB and approximately −79 dB, respectively, which results in sufficient suppression of the second-order harmonic, the band-pass characteristic at the lower fundamental frequency F1 (800 MHz) is approximately −4.1 dB, which cannot be ignored.

In contrast, the graph 301 (the present invention) in FIG. 2 proves that: in the output matching circuit of the present invention provided with one second-order series resonant circuit having an inductance of 1 nH or larger and one second-order series resonant circuit having an inductance of 1 nH or lower, the fundamental frequency component loss is prevented while the broadband second-order harmonic component is suppressed, as described above.

What is claimed is:

1. A power amplifier for amplifying an input signal having a fundamental frequency of which band width ranges between a first fundamental frequency F1 and a second fundamental frequency F2, comprising:

a power amplifier transistor for amplifying the input signal; and an output matching circuit for suppressing a harmonic component included in an output signal from the power amplifier transistor, wherein the output matching circuit includes:

a first series resonant circuit including a first inductor and a first capacitor, which are connected in series to each other between an output end of the power amplifier transistor and a ground, and having a second-order harmonic frequency of the first fundamental frequency F1 as a resonance frequency thereof; and a second series resonant circuit including a second inductor and a second capacitor, which are connected in series to each other between the output end of the power amplifier transistor and the ground, and having a second-order harmonic frequency of the second fundamental frequency F2 as a resonance frequency thereof, the first inductor has an inductance of 1 nH or larger, and the second inductor has an inductance of 1 nH or lower.

2. The power amplifier of claim 1, wherein the second inductor is composed of a microstrip line.

3. The power amplifier of claim 1,
wherein the first capacitor is integrated on a semiconductor substrate on which the power amplifier transistor is integrated, and
the second capacitor is a chip component.

4. The power amplifier of claim 1,
wherein the first capacitor is integrated on a semiconductor substrate on which the power amplifier transistor is integrated, and
the second capacitor is integrated on another semiconductor substrate different from the semiconductor substrate on which the power amplifier transistor is integrated.

5. The power amplifier of claim 1, wherein the band width is 50 MHz or larger.

6. The power amplifier of claim 1, wherein the second inductor is arranged between the output end of the power amplifier transistor and a predetermined branch point on a bias line connected to the output end and supplying power to the power amplifier transistor.

7. The power amplifier of claim 6, wherein the second capacitor is connected at one end thereof to a line branching from the bias line at the predetermined branch point and is connected at another end thereof to the ground.

8. The power amplifier of claim 6, further comprising:
a bypass capacitor having a capacitance of 1000 pF or larger and connected to a voltage source connection part of the bias line, and
a part of the bias line which ranges from the bypass capacitor to the predetermined branch point has an inductance corresponding to an electric length in a range between λ/16 and λ/8, both inclusive, wherein λ represents a wavelength of the input signal.

* * * * *